United States Patent
Wang (10) Patent No.: US 9,715,259 B1
(45) Date of Patent: Jul. 25, 2017

(54) SERVER AND DATA STORAGE DEVICE MOUNTING STRUCTURE

(71) Applicant: HON HAI PRECISION INDUSTRY CO., LTD., New Taipei (TW)

(72) Inventor: Peng-Kuei Wang, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 15/186,704

(22) Filed: Jun. 20, 2016

(30) Foreign Application Priority Data

Apr. 27, 2016 (CN) .......................... 2016 1 0267409

(51) Int. Cl.
*H05K 7/16* (2006.01)
*G06F 1/16* (2006.01)
*G06F 1/18* (2006.01)
*H05K 7/14* (2006.01)

(52) U.S. Cl.
CPC ........... *G06F 1/187* (2013.01); *H05K 7/1489* (2013.01)

(58) Field of Classification Search
CPC ............................... G06F 1/187; H05K 7/1489
USPC .... 361/679.33–679.39, 724–727; 312/223.1, 312/223.2
See application file for complete search history.

(56) References Cited

U.S. PATENT DOCUMENTS

| 5,734,557 | A  | * | 3/1998  | McAnally | G11B 33/124 361/679.58 |
| 6,069,789 | A  | * | 5/2000  | Jung     | G06F 1/184 312/223.2 |
| 9,172,153 | B2 | * | 10/2015 | Tsai     | G11B 33/124 |
| 2002/0043908 | A1 | * | 4/2002 | Gan | G06F 1/184 312/223.2 |
| 2006/0002078 | A1 | * | 1/2006 | Jing | G11B 33/128 361/679.33 |
| 2007/0164170 | A1 | * | 7/2007 | Huang | G06F 1/187 248/27.1 |
| 2008/0253078 | A1 | * | 10/2008 | Neukam | G06F 1/183 361/679.31 |

* cited by examiner

*Primary Examiner* — Nidhi Thaker
(74) *Attorney, Agent, or Firm* — Steven Reiss (57) ABSTRACT

A server allowing individual dismounting of data storage units includes a housing, a frame, and a data storage device mounting structure. The frame defines two openings and is slidably attached to the housing. The data storage device mounting structure includes a fixing plate rotationally attached to the frame. The fixing plate includes a first end, a second end opposite to the first end, and a protrusion extending from each of the first end and the second end. The two protrusions are alternately received in the two openings. When the protrusion on the second end is received in an opening, the protrusion on the first end is retracts from the other opening and the protrusion on the second end abuts against the housing to allow a single data storage unit but not the frame to be taken out of the housing.

20 Claims, 9 Drawing Sheets

SERVER AND DATA STORAGE DEVICE MOUNTING STRUCTURE

CROSS-REFERENCE TO RELATED APPLICATIONS

This application claims priority to Chinese Patent Application No. 201610267409.9, filed on Apr. 27, 2016, the contents of which are incorporated by reference herein.

FIELD

The subject matter herein generally relates to mounting apparatus.

BACKGROUND

Servers include at least one frame to receive at least one data storage device. The data storage device is fixed to the frame. When the data storage device is to be taken out of the server, the frame must be taken out of the server.

BRIEF DESCRIPTION OF THE DRAWINGS

Implementations of the present technology will now be described, by way of example only, with reference to the attached figures.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

A definition that applies throughout this disclosure will now be presented.

The term "comprising" means "including, but not necessarily limited to"; it specifically indicates open-ended inclusion or membership in a so-described combination, group, series, and the like.

Figure 1:
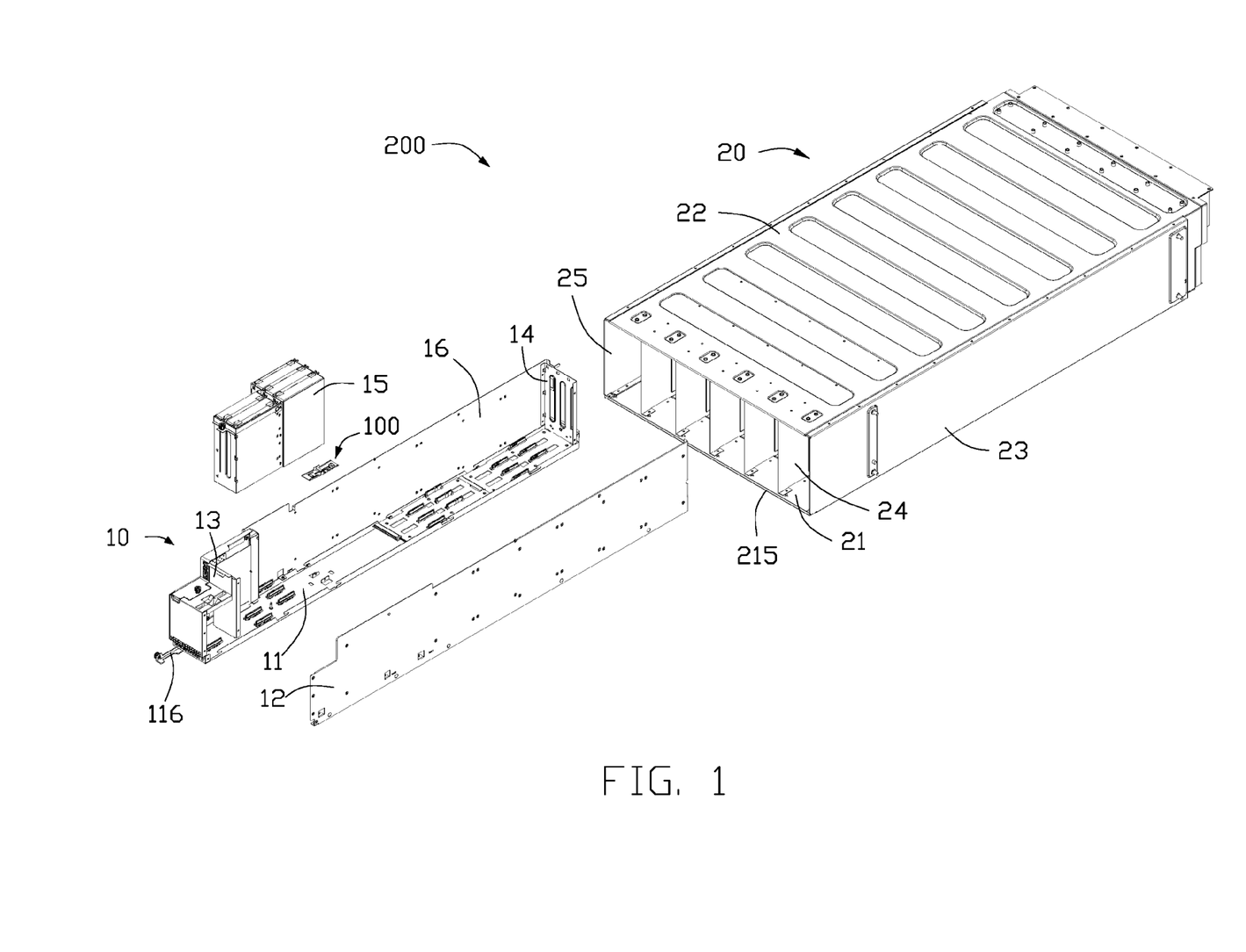
FIG. 1 is an exploded isometric view of a server.
Figure 2:
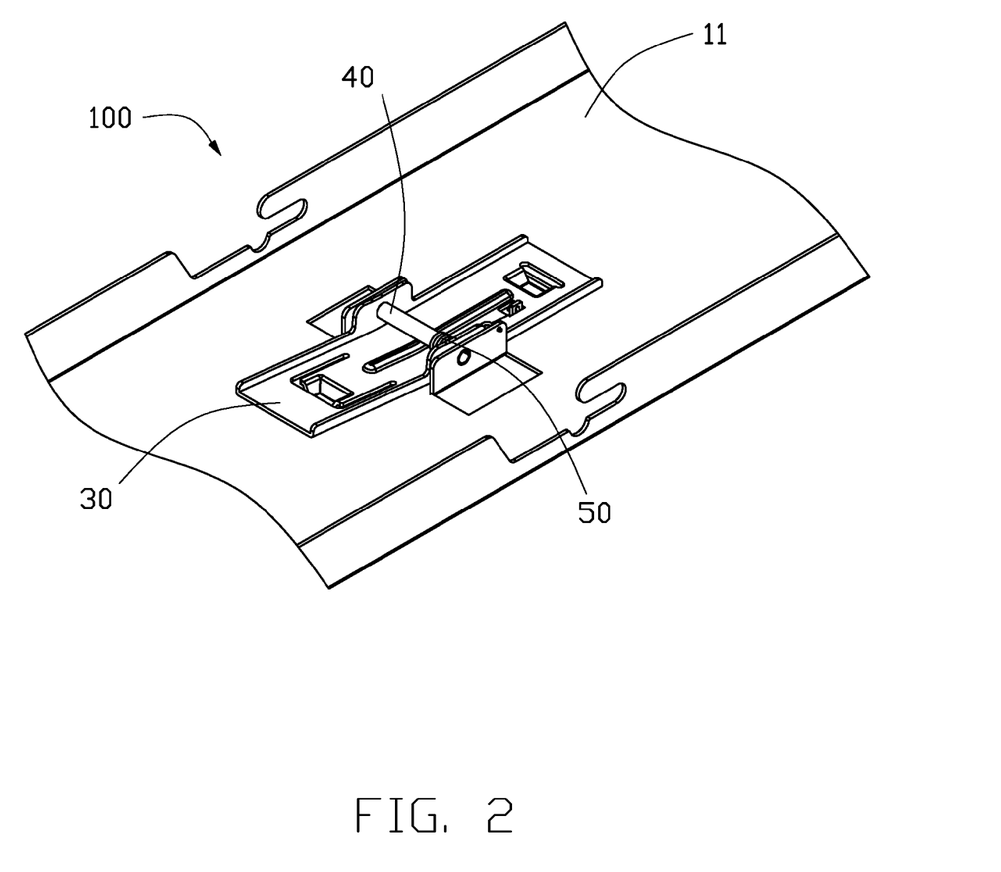
FIG. 2 is an isometric view of the data storage device mounting structure of FIG. 1 attached to a bottom wall of the server.

FIGS. 1 and 2 illustrate a server 200. The server 200 includes a frame 10, a data storage device mounting structure 100 fixed to the frame 10, and a housing 20. The frame 10 is configured to store at least one data storage device 15. The frame 10 is slidably attached to the housing 20. The data storage device mounting structure 100 includes a fixing plate 30, a shaft 40, and an elastic piece 50 sleeved on the shaft 40.

Figure 6:
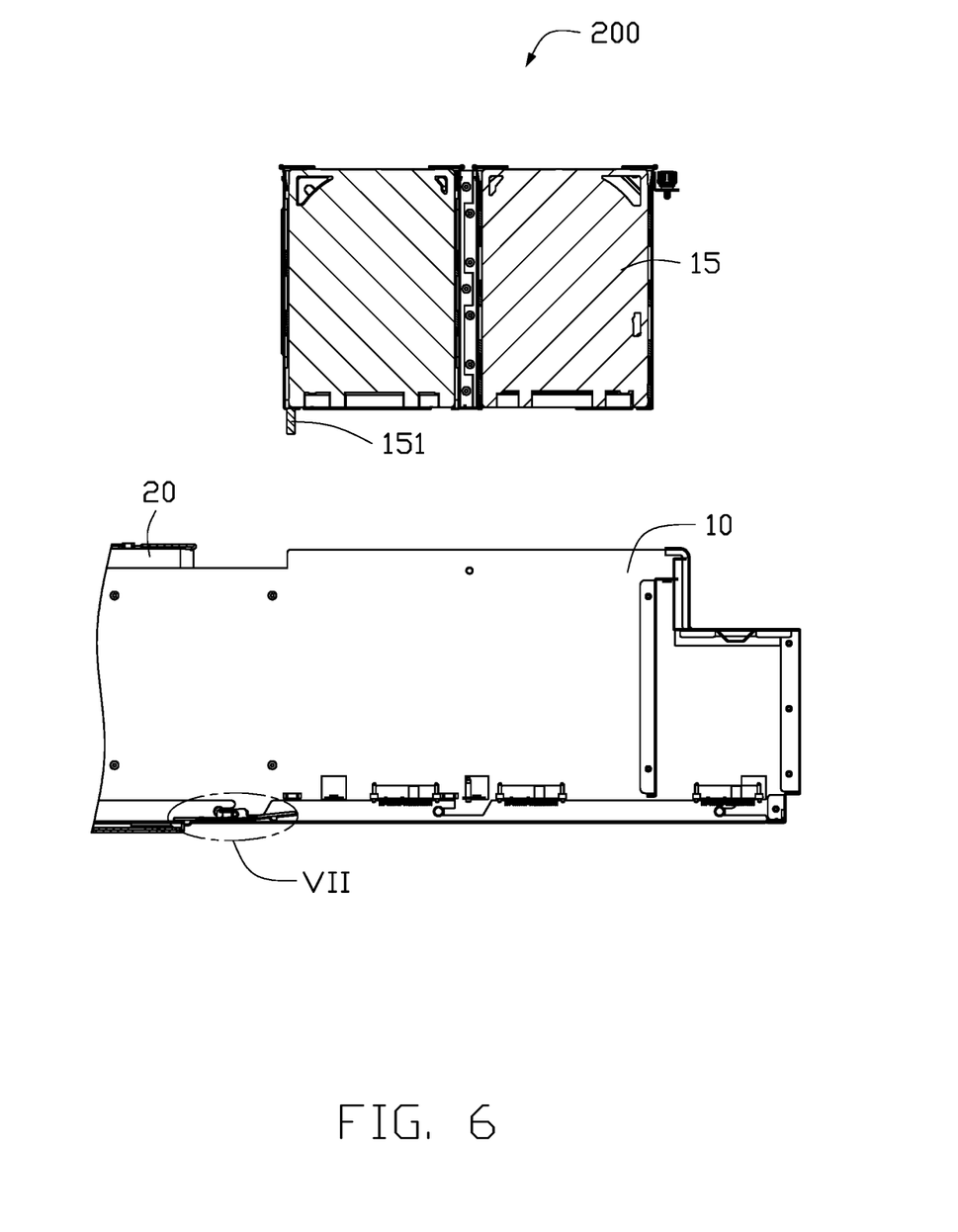
FIG. 6 is a cross-sectional view taken along the line VI-VI of FIG. 5.
Figure 7:
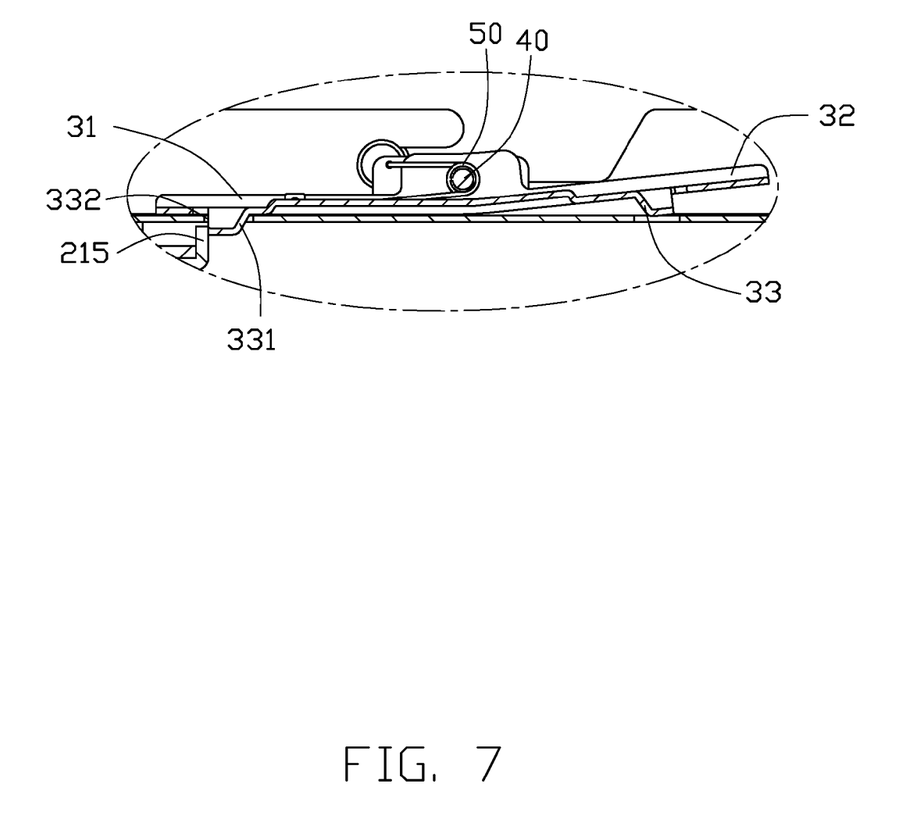
FIG. 7 is enlarged view of the circled portion VII of FIG. 6.
Figure 8:
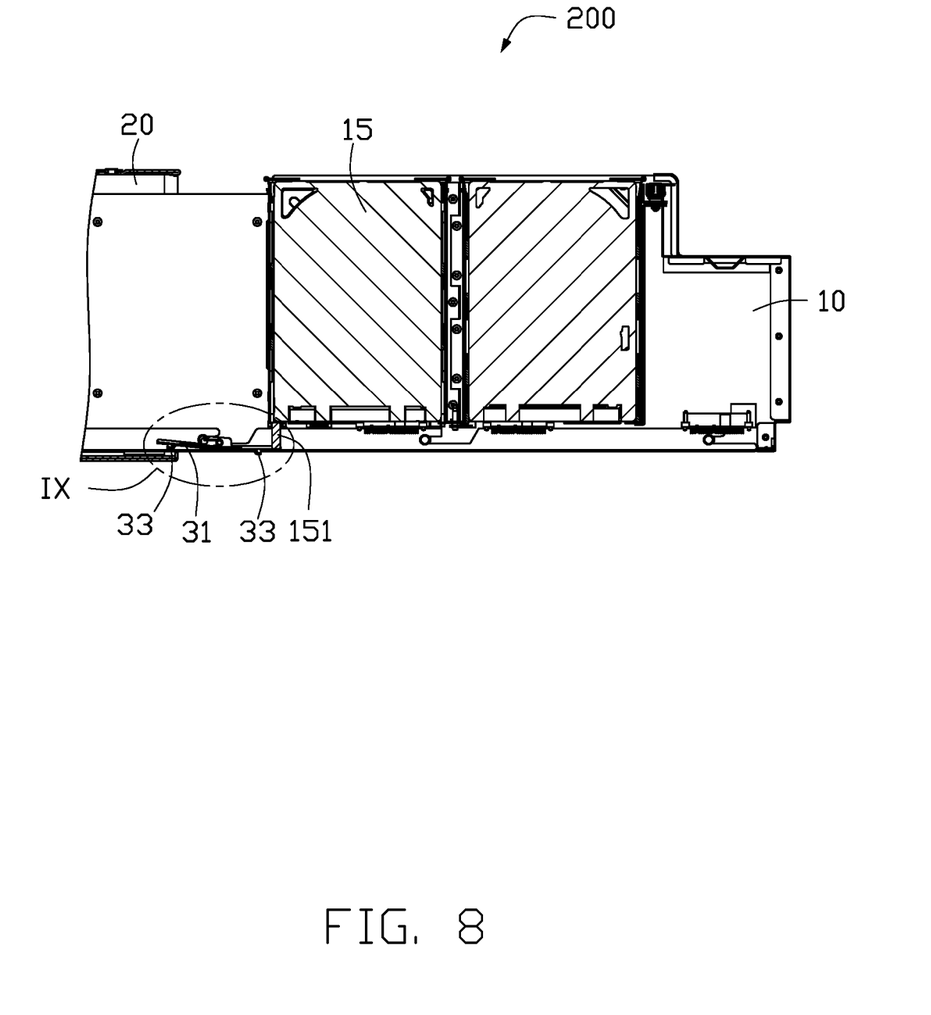
FIG. 8 is similar to FIG. 7, but with a data storage device assembled to a frame.
Figure 9:
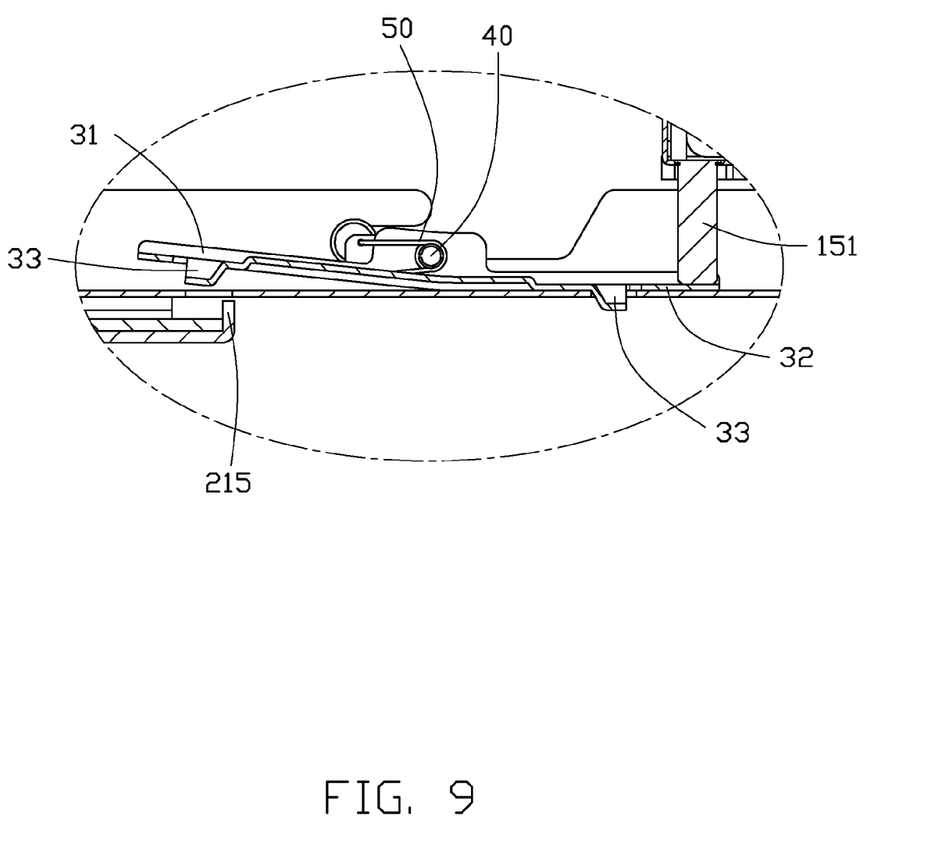
FIG. 9 is enlarged view of the circled portion IX of FIG. 8.

The frame 10 includes a bottom wall 11, two sidewalls 12 perpendicularly connected to two opposite edges of the bottom wall 11, a front wall 13, and a rear wall 14. The front wall 13 and the rear wall 14 are positioned between the two sidewalls 12 and are parallel to each other. The bottom wall 11, the two sidewalls 12, the front wall 13, and the rear wall 14 define a receiving space 16. The data storage device 15 is received in the receiving space 16. The data storage device 15 includes a pillar 151 (FIG. 6) opposite to the bottom wall 11. The pillar 151 abuts against the fixing plate 30.

Figure 3:
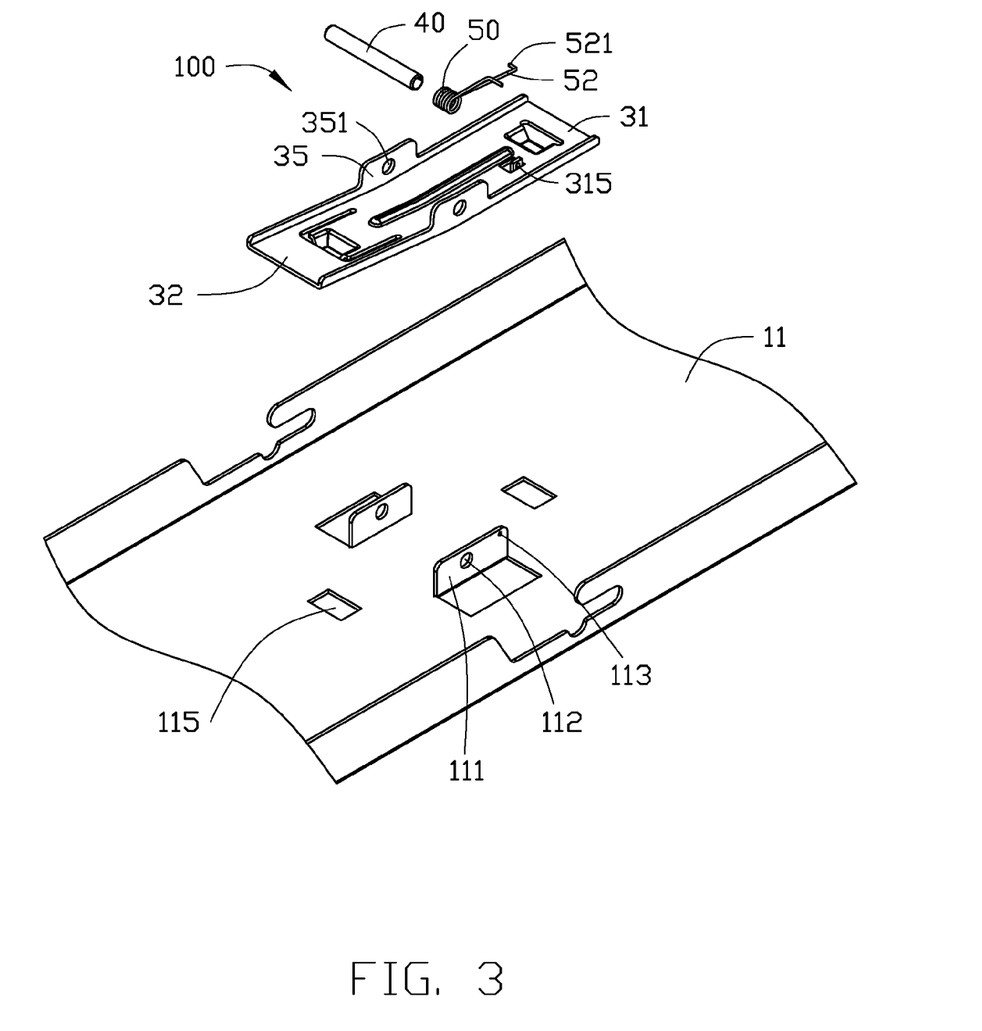
FIG. 3 is an exploded isometric view of the data storage device mounting structure of FIG. 2 with the bottom wall.

In FIG. 3, two support plates 111 perpendicularly extend from substantially a middle of an inner side of the bottom wall 11. The support plates 111 are substantially parallel to each other. Each support plate 111 defines a shaft hole 112. One of the two support plates 111 further defines a restriction hole 113. The bottom wall 11 defines two openings 115 positioned two ends of the support plate 111. A pole 116 protrudes from an end of the bottom plate 11 adjacent to the front wall 13. The pole 116 is configured to allow a user to pull the frame 10 to slide.

The housing 20 includes a bottom shell 21, a top shell 22 parallel to the bottom shell 21, two lateral shells 23 connected to the bottom shell 21 and the top shell 22, and a rear shell (not shown). A blocking plate 215 extends from an edge of the bottom shell 21 away from the rear shell toward the top shell 22. The housing 20 includes a plurality of separating plates 24. The separating plates 24 are parallel to each other and fixed between the bottom shell 21 and the top shell 22 to create a plurality of installing spaces 25. A frame 10 can be slidably received in each of the installing spaces 25.

Figure 4:
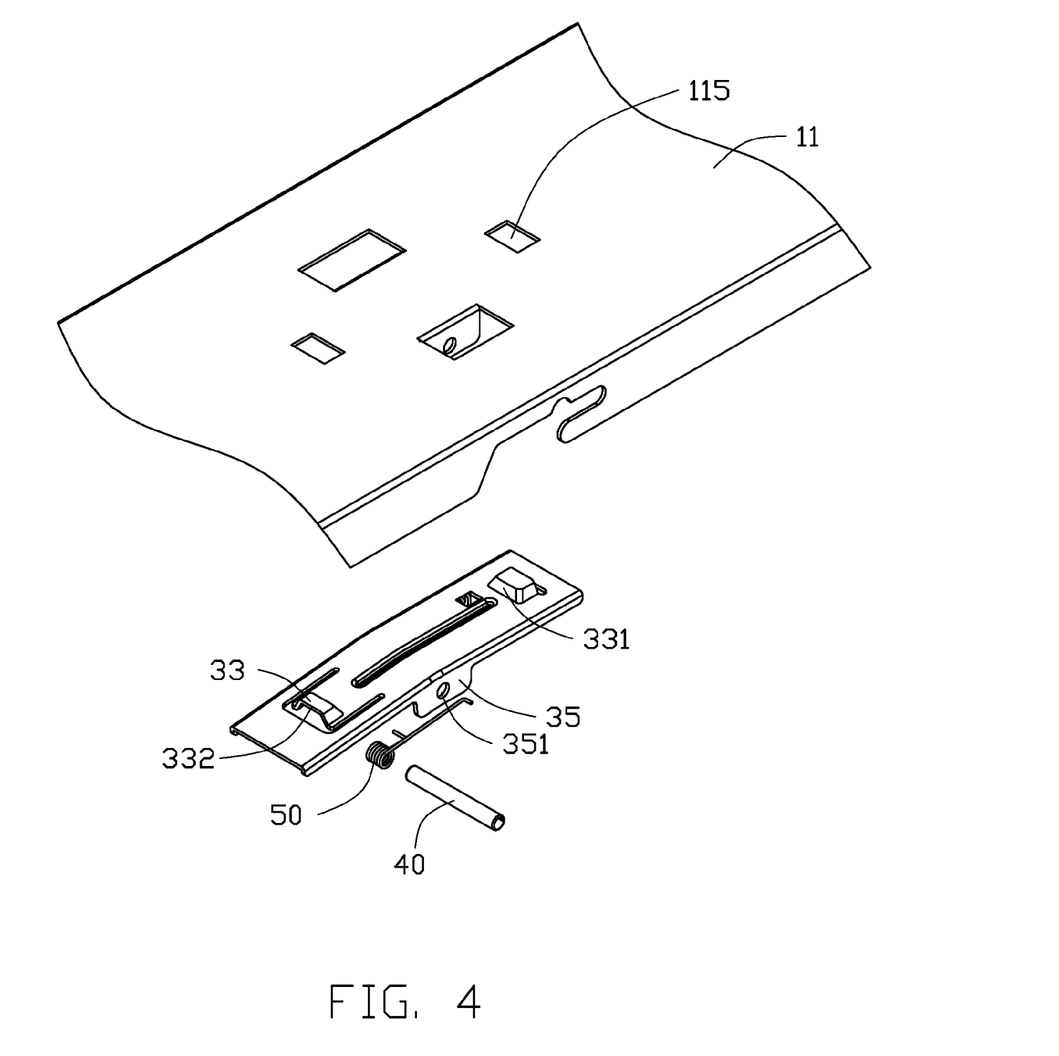
FIG. 4 is similar to FIG. 3, but viewed from a different viewpoint.
Figure 5:
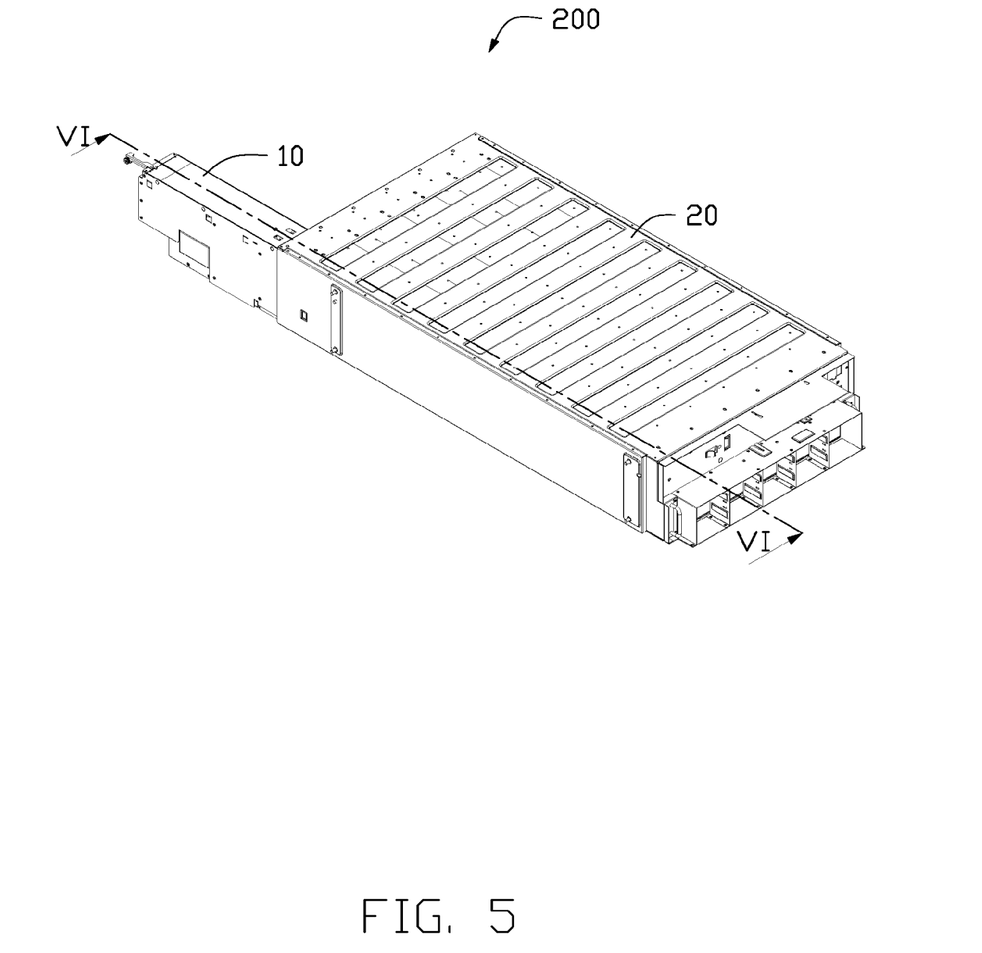
FIG. 5 is an isometric view of the server of FIG. 1.

Referring to FIGS. 2 to 4, the fixing plate 30 includes a first end 31 and a second end 32 opposite to the first end 31. The first end 31 and the second end 32 form an obtuse angle, the vertex of which is located towards the middle of the fixing plate 30. The fixing plate 30 includes two protrusions 33, with the first and second protrusions extending from a side of the first end 31 and the second end 32 opposite to the direction of bending, respectively. Each of the protrusions 33 can be received in the one of the two openings 115, respectively. Each protrusion 33 includes a guiding surface 331 and a locking surface 332 opposite to the guiding surface 331. The two guiding surfaces 331 face each other and are oblique to the first end 31 and the second end 32. The two locking surfaces 332 are perpendicular to the first end 31 and the second end 32. The fixing plate 30 further defines a locking hole 315 positioned between the two protrusions 33.

The fixing plate 30 further includes the two restriction plates 35. The two restriction plates 35 extend from substantially the middle of two opposite edges of the fixing plate 30. Each restriction plate 35 defines a through hole 351. The shaft 40 is received in the two through holes 351. The elastic piece 50 includes two elastic arms 52. A distal end of each elastic arm 52 is bent to form a hook 521. The first and second hooks 521 are hooked to the restriction hole 113 and the locking hole 315, respectively.

FIGS. 5-9 illustrate the assembling of the data storage device mounting structure 100. The elastic piece 50 is sleeved on the shaft 40. The fixing plate 30 is positioned between the two support plates 111. The first end 31 is adjacent to the rear wall 14. The second end 32 is adjacent to the front wall 13. The two shaft holes 112 are aligned with the two through holes 351. Two ends of the shaft 40 are received in the two shaft holes 112.

Rotating the two elastic arms 52 causes the hook 521 of one elastic arm 52 to lock to the locking hole 315 and causes the hook 521 of the other elastic arm 52 to lock to the restriction hole 113. The two elastic arms 52 enable the protrusion 33 on the first end 31 to rotate, to pass through the opening 115 to assemble the data storage device mounting structure 100 to the bottom wall 11. The protrusion 33 on the second end 32 is away from the other opening 115. The frame 10 is slidable into the installing space 25 to enable the locking surface 332 of the protrusion 33 on the first end 31 to abut against the blocking plate 215.

The data storage device 15 is thus received in the receiving space 16. The pillar 151 abuts against the second end 32 to enable the second end 32 to rotate to make the protrusion 33 on the second end 32 pass through the opening 115. Such rotation enables the first end 31 to rotate upward to disassemble the protrusion 33 on the first end 31 from the opening 115 and the blocking plate 215. The two elastic arms 52 are deformed toward each other. The pole 116 is pushed toward the installing space 25. When the protrusion 33 on the second end 32 slides on the blocking plate 215, the blocking plate 215 abuts against the guiding surface 331 of the protrusion 33 on the second end 32 to enable the second end 32 to move upward, to pass through the blocking plate 215. The frame 10 is pushed to enable the protrusion 33 of the second end 32 to slide over the blocking plate 215. The frame 10 is thereby slidably assembled to the housing 20 and the data storage device 15 is received in the housing 20.

To disassemble the data storage device 15, the pole 116 is pushed to enable the locking surface 332 of the protrusion 33 on the second end 32 to abut against the blocking plate 215. The frame 10 is blocked by the blocking plate 215. Thus, the frame 10 cannot slide out of the housing 20 but the data storage device 10 can be taken out of the housing 20.

The embodiments shown and described above are only examples. Even though numerous descriptions and advantages of the present technology have been set forth in the foregoing description, together with details of the structure and function of the present disclosure, the disclosure is illustrative only, and changes may be made in the details, including in matters of shape, size, and arrangement of the parts within the principles of the present disclosure, up to and including the full extent established by the broad general meaning of the terms used in the claims.

What is claimed is:

1. A server comprising:
    a housing;
    a frame defining two openings and the frame slidably attached to the housing; and
    a data storage device mounting structure comprising a fixing plate rotationally attached to the frame, the fixing plate comprising a first end, a second end opposite to the first end and a protrusion extending from each of the first end and the second end, one of the protrusions enabled to be received in one of the two openings and the other protrusion enabled to be received in the other opening;
    wherein when the protrusion on the first end is received in its corresponding opening, the protrusion on the second end retracts from the other opening, when the protrusion on the second end is received in a corresponding opening, the protrusion on the first end retracts from the other opening and the protrusion on the second end abuts against the housing to prevent the frame from sliding out of the housing.

2. The server as claimed in claim 1, wherein the frame comprises a bottom wall, the bottom wall defines the two openings.

3. The server as claimed in claim 2, wherein two support plates are perpendicularly extended from a middle of an inner side of the bottom wall, the support plates are substantially parallel to each other, each support plate defines a shaft hole for receiving a shaft.

4. The server as claimed in claim 3, wherein the two restriction plates extend from substantially adjacent a middle of two opposite edges of the fixing plate, each restriction plate defines a through hole for receiving the shaft.

5. The server as claimed in claim 4, wherein the data storage device mounting structure further comprises an elastic piece, the elastic piece sleeves on the shaft and is positioned between the two restriction plates.

6. The server as claimed in claim 5, wherein the elastic piece comprises two elastic arms, a distal end of the each elastic arm is bent to form a hook, the fixing plate further defines a locking hole positioned between the two protrusions, one of the two hooks is hooked to the locking hole.

7. The server as claimed in claim 6, wherein one of the two support plates defines a restriction hole, the other hook is hooked to the restriction hole.

8. The server as claimed in claim 1, wherein the housing comprises a bottom shell and a top shell parallel to the bottom shell, a blocking plate extends from an edge of the bottom shell toward the top shell, the protrusion on the second end abuts against the blocking plate.

9. A server comprising:
    a housing;
    a frame defining two openings and the frame slidably attached to the housing; and
    a data storage device mounting structure comprising a fixing plate rotationally attached to the frame, the fixing plate comprising a first end, a second end opposite to the first end and a protrusion extending from each of the first end and the second end, the two protrusions corresponding to the two openings and alternately received in the two openings;
    wherein when the protrusion on the second end is received in a corresponding opening, the protrusion on the first end retracts from the other opening and the protrusion on the second end abuts against the housing to prevent the frame sliding out of the housing.

10. The server as claimed in claim 9, wherein the frame comprises a bottom wall, the bottom wall defines the two openings.

11. The server as claimed in claim 10, wherein two support plates are perpendicularly extended from a middle of an inner side of the bottom wall, the support plates are substantially parallel to each other, each support plate defines a shaft hole for receiving a shaft.

12. The server as claimed in claim 11, wherein two restriction plates extend from middle of two opposite edges of the fixing plate, each restriction plate defines a through hole for receiving the shaft.

13. The server as claimed in claim 12, wherein the data storage device mounting structure further comprises an elastic piece, the elastic piece sleeves on the shaft and is positioned between the two restriction plates.

14. The server as claimed in claim 13, wherein the elastic piece comprises two elastic arms, a distal end of the each elastic arm is bent to form a hook, the fixing plate further defines a locking hole positioned between the two protrusions, one of the two hooks is hooked to the locking hole.

15. The server as claimed in claim 14, wherein one of the two support plates defines a restriction hole, the other hook is hooked to the restriction hole.

16. The server as claimed in claim 9, wherein the housing comprises a bottom shell and a top shell parallel to the bottom shell, a blocking plate extends from an edge of the bottom shell toward the top shell, the protrusion on the second end abuts against the blocking plate.

17. A data storage device mounting structure configured to assemble to a frame, the frame defining two openings and the frame slidably attached to a housing, the data storage device mounting structure comprising:
 a fixing plate rotationally attached to the frame, the fixing plate comprising a first end, a second end opposite to the first end and a protrusion extending from each of the first end and the second end, the first end and the second end form an obtuse angle, the vertex of which is located towards the middle of the fixing plate, one of the protrusions enabled to be received in one of the two openings and the other protrusion enabled to be received in the other openings;
 wherein when the protrusion on the first end received in the corresponding opening, the protrusion on the second end retracts from the corresponding opening, when the protrusion on the second end received in the corresponding opening, the protrusion on the first end retracts from the corresponding opening and the protrusion on the second end abuts against the housing to prevent the frame sliding out of the housing.

18. The data storage device mounting structure as claimed in claim 17, wherein the frame comprises a bottom wall, the bottom wall defines the two openings, two support plates are perpendicularly extended from a middle of an inner side of the bottom wall, the support plates are substantially parallel to each other, each support plate defines a shaft hole for receiving a shaft.

19. The server as claimed in claim 18, wherein two restriction plates extend from middle of two opposite edges of the fixing plate, each restriction plate defines a through hole for receiving the shaft.

20. The server as claimed in claim 19, wherein the data storage device mounting structure further comprises an elastic piece, the elastic piece sleeves on the shaft and is positioned between the two restriction plates, the elastic piece comprises two elastic arms, a distal end of the each elastic arm is bent to form a hook, the fixing plate further defines a locking hole positioned between the two protrusions, one of the two hooks is hooked to the locking hole, one of the two support plates defines a restriction hole, the other hook is hooked to the restriction hole.

* * * * *